United States Patent
Zhao et al.

(10) Patent No.: US 10,580,843 B2
(45) Date of Patent: Mar. 3, 2020

(54) SUBSTRATE AND FABRICATION METHOD THEREOF, AND DISPLAY DEVICE

(71) Applicant: BOE TECHNOLOGY GROUP CO., LTD., Beijing (CN)

(72) Inventors: Dejiang Zhao, Beijing (CN); Guangcai Yuan, Beijing (CN); Liwen Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/136,784

(22) Filed: Sep. 20, 2018

(65) Prior Publication Data

US 2019/0237525 A1    Aug. 1, 2019

(30) Foreign Application Priority Data

Jan. 31, 2018    (CN) .......................... 2018 1 0098359

(51) Int. Cl.
*H01L 27/32* (2006.01)
*H01L 51/56* (2006.01)
*H01L 51/52* (2006.01)
*C23C 16/00* (2006.01)

(52) U.S. Cl.
CPC ...... *H01L 27/3246* (2013.01); *H01L 51/5203* (2013.01); *H01L 51/5237* (2013.01); *H01L 51/56* (2013.01); *C23C 16/00* (2013.01)

(58) Field of Classification Search
CPC . H01L 27/3246; H01L 51/56; H01L 51/5203; H01L 51/5237; C23C 16/00
See application file for complete search history.

(56) References Cited

U.S. PATENT DOCUMENTS

| | | | | |
|---|---|---|---|---|
| 6,476,988 | B1 * | 11/2002 | Yudasaka | G02B 5/201 359/885 |
| 8,987,717 | B2 * | 3/2015 | Kang | H01L 51/52 257/40 |
| 2014/0131743 | A1 * | 5/2014 | Jiang | H01L 27/3246 257/88 |

* cited by examiner

*Primary Examiner* — Karen Kusumakar
(74) *Attorney, Agent, or Firm* — Ladas & Parry LLP; Hermine Valizadeh

(57) ABSTRACT

Embodiments of the present invention provide a substrate and a fabrication method thereof, and a display device. The substrate includes a base and a pixel defining layer in which a plurality of openings are formed, the pixel defining layer includes a first defining layer, a second defining layer and a third defining layer sequentially stacked on the base, wherein, the second defining layer is configured as a conductive layer, and an orthogonal projection of the second defining layer on the base is at least partially located outside an orthogonal projection of a side of the third defining layer close to the base on the base.

17 Claims, 6 Drawing Sheets

SUBSTRATE AND FABRICATION METHOD THEREOF, AND DISPLAY DEVICE

TECHNICAL FIELD

At least one embodiment of the present disclosure relates to a substrate and a fabrication method thereof, and a display device.

BACKGROUND

An organic light-emitting display device has become a key display technology, due to advantages such as self-luminescence, fast response, wide viewing angle, high brightness, brilliant color, thinness and lightness. A light-emitting material layer in the organic light-emitting display device may generally be formed in a mode of inkjet printing, and in the inkjet printing method for forming the light-emitting material layer, it is necessary to fabricate a pixel defining layer defining the pixel region on a base substrate in advance, so that an ink drop can be precisely injected into a designated pixel region. However, a current pixel defining layer structure is not able to adjust thicknesses of respective film layers in the organic light emitting device while ensuring an electrical performance of the organic light emitting device, which restricts a further enhancement of the electrical performance of the organic light emitting device.

SUMMARY

At least one embodiment of the present invention provides a substrate, and the substrate includes a base and a pixel defining layer in which a plurality of openings are formed, the pixel defining layer includes a first defining layer, a second defining layer and a third defining layer sequentially stacked on the base, wherein, the second defining layer is configured as a conductive layer, and an orthogonal projection of the second defining layer on the base is at least partially located outside an orthogonal projection of a side of the third defining layer close to the base on the base.

At least one embodiment of the present invention provides a display device, comprising the substrate as mentioned above.

At least one embodiment of the present invention provides a fabrication method of a substrate, comprising: providing a base; forming a pixel defining layer on the base, a plurality of openings being formed in the pixel defining layer; wherein, the pixel defining layer includes a first defining layer, a second defining layer and a third defining layer sequentially formed on the base, the second defining layer is formed as a conductive layer, and an orthogonal projection of the second defining layer on the base is at least partially located outside an orthogonal projection of a side of the third defining layer close to the base on the base.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
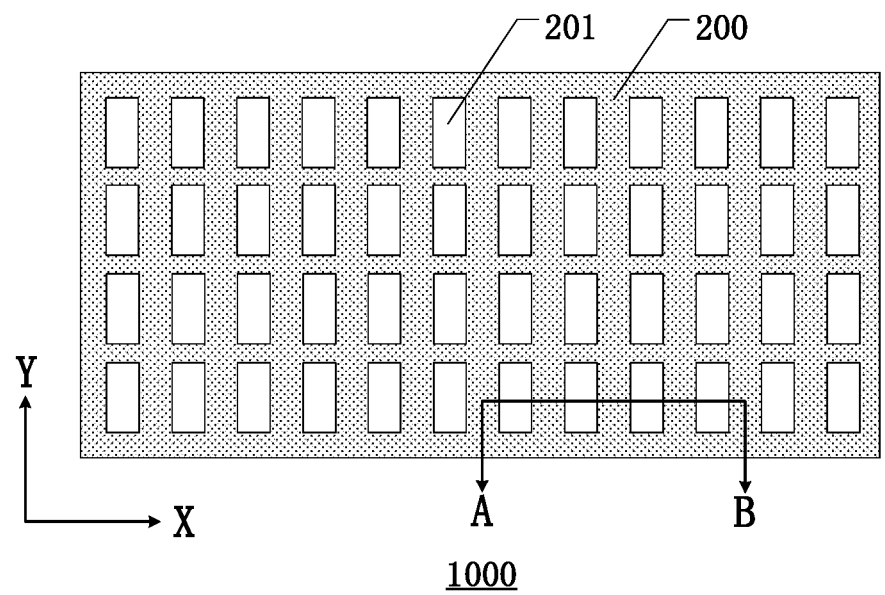
FIG. 1A is a plan view of a display region of a substrate provided by an embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

In a current process, since a capacity of a pixel defining layer is limited, a thickness of a film layer formed by inkjet printing in an organic light emitting device may be limited, so as to limit a performance of the organic light emitting device. If it is necessary to adjust the thickness of the film layer (for example, increase the thickness of the film layer), it is necessary to increase the capacity of the pixel defining layer, that is, increase the thickness of the pixel defining layer. However, when other structures, for example, a common electrode, of the organic light emitting device are fabricated subsequently, a thickness of the pixel defining layer is increased, so that a step difference of the formed common electrode is correspondingly increased, resulting in excessively small thickness or fracture in a local region of the common electrode, which increases electrical resistivity of the common electrode, reduces an electrical performance of the organic light emitting device, and affects a yield of the substrate.

At least one embodiment of the present disclosure provides a substrate, comprising: a base; a pixel defining layer, provided with a plurality of openings, the pixel defining layer including a first defining layer, a second defining layer and a third defining layer sequentially stacked on the base, wherein, the second defining layer is configured as a conductive layer, and an orthogonal projection of the second defining layer on the base is at least partially located outside an orthogonal projection of a side of the third defining layer close to the base on the base. The pixel defining layer having a three-layer structure can enhance its ability to store ink, and accordingly, can increase a thickness of a film layer formed by ink, so as to facilitate adjustment of thicknesses of respective film layers in an organic light emitting device formed in the pixel defining layer during a subsequent process; in addition, after the thicknesses of the respective film layers in the organic light emitting device are increased, a step difference between a surface of the film layer away from the base and a surface of the first pixel defining layer away from the base is reduced, which even enables the surface of the film layer away from the base and the surface of the first pixel defining layer away from the base to be located within a same horizontal plane, and accordingly, a step difference of a common electrode of the organic light emitting device (a height difference between a first electrode and the second defining layer according to an embodiment below) will also be reduced, which further eliminates the step difference, improves an electrical performance of the organic light emitting device, and improves a yield of the substrate.

Hereinafter, a substrate and a fabrication method thereof, and a display device according to at least one embodiment of the present disclosure will be described with reference to the accompanying drawings.

Figure 1B:
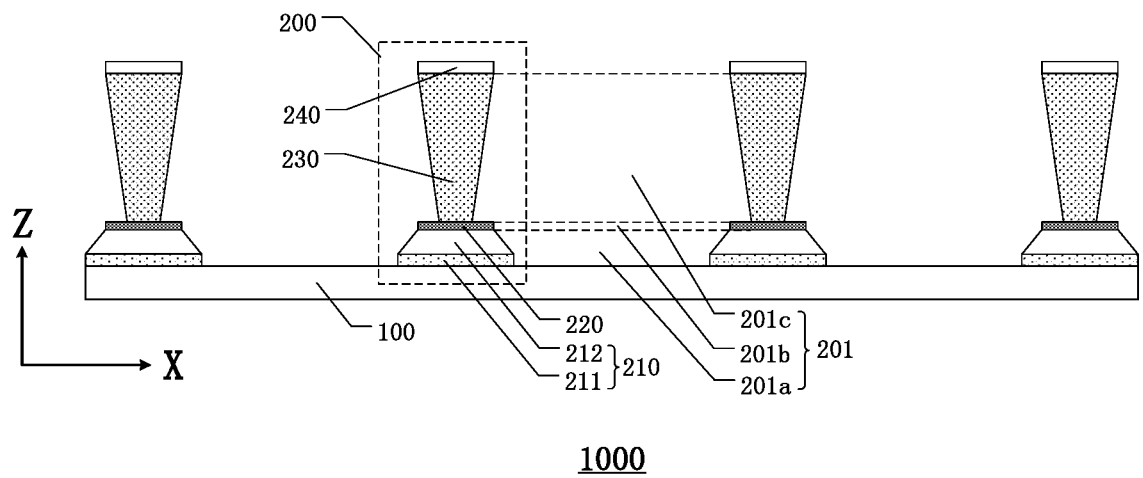
FIG. 1B is a cross-sectional view of the substrate of FIG. 1A along line A-B.

FIG. 1A is a plan view of a display region of a substrate provided by an embodiment of the present disclosure; and FIG. 1B is a cross-sectional view of the substrate of FIG. 1A along line A-B.

At least one embodiment of the present disclosure provides a substrate, and as shown in FIG. 1A and FIG. 1B, a substrate 1000 comprises: a base 100 and a pixel defining layer 200, wherein, the pixel defining layer 200 is provided therein with a plurality of openings 201, the pixel defining layer 200 includes a first defining layer 210, a second defining layer 220 and a third defining layer 230 sequentially stacked on the base 100; the second defining layer 220 is configured as a conductive layer. In a case that no other structures (for example, a first electrode 310, a first inorganic encapsulation layer 400, the second inorganic encapsulation layer 500, etc., according to the embodiment illustrated in FIG. 2) are formed in an opening 201, the second defining layer 220 is configured to expose at least a portion of the second defining layer 220. For example, an orthogonal projection of the second defining layer 220 on the base 100 may be located at least partially outside an orthogonal projection of a side of the third defining layer 230 close to the base 100 on the base 100. For example, in a subsequent fabrication process of the substrate, it is necessary to form an organic light emitting device (for example, the organic light emitting device 300 in FIG. 2) within the opening 201 of the pixel defining layer. As compared with a case where only the first defining layer 210 is provided, the second defining layer 220 and the third defining layer 230 can increase a capacity of the opening 201 of the pixel defining layer 200, and in a procedure of inkjet printing, the opening 201 can accommodate more ink, so that a film thickness of a member (for example, a light-emitting material layer 320 in FIG. 2) required to be formed by inkjet printing is not limited; further, in a case that no other structures are formed in an opening 201, the second defining layer 220 exposes at least a portion of the second defining layer 220, such that the exposed portion of the second defining layer 220 may be connected with an electrode (for example, the first electrode 310 in FIG. 2) of the organic light emitting device formed in the opening 201, to constitute a common electrode, so as to reduce a step difference of the common electrode, improve an electrical performance of the organic light emitting device, and enhance a yield of the substrate 1000.

In at least one embodiment of the present disclosure, as shown in FIG. 1A and FIG. 1B, a spatial coordinate system is established with reference to a base 100, and directive description will be provided for positions of respective structures in a substrate 1000. For example, in the spatial coordinate system, directions of an X-axis and a Y-axis are parallel to a plane where the base 100 is located, and a Z-axis is perpendicular to the plane where the base 100 is located. Further, "upper" and "lower" are distinguished by a distance from the base 100, "upper" is a position close to the base, and "lower" is a position away from the base 100. Exemplarily, with the third defining layer 230 in FIG. 1B as an example, the second defining layer 220 is located below the third defining layer 230, and the third defining layer 230 is located above the second defining layer 220; a surface of the third defining layer 230 close to the base 100 is a lower surface of the third defining layer 230, and a surface of the third defining layer 230 away from the base 100 is an upper surface of the third defining layer 230. Further, "height" is a distance from a surface of the structure layer away from the base 100 to the base 100. Exemplarily, as shown in FIG. 1B, a height of the second defining layer 220 is greater than a height of the first defining layer 210. "Thickness" is a distance from a side of the structure layer close to the base to a side of the structure layer away from the base. Exemplarily, as shown in FIG. 1B, a thickness of the second defining layer 220 is a height of an upper surface of the second defining layer 220 deducted by a height of a lower surface of the second defining layer 220.

In at least one embodiment of the present disclosure, relative positional relationship among the first defining layer, the second defining layer and the third defining layer will not be limited.

In at least one embodiment of the present disclosure, a size of the second defining layer may be less than or equal to a size of the first defining layer, which will not be limited by the embodiment of the present disclosure. For example, with a case where the size of the second defining layer equals to the size of the first defining layer as an example, in a substrate provided by at least one embodiment of the present disclosure, an orthogonal projection of the first defining layer on the base coincides with an orthogonal projection of the second defining layer on the base. Exemplarily, as shown in FIG. 1B, the orthogonal projection of the second defining layer 220 on the base 100 coincides with the orthogonal projection of the first defining layer 210 on the base 100. For example, the first defining layer 210 and the second defining layer 220 may be formed by a same patterning process, or the first defining layer 210 may be subjected to a patterning process with the second defining layer 220 (in a case where the second defining layer 220 is made of a non-transparent conductive material) as a mask. It should be noted that, in an actual process, as limited by a patterning process, a sidewall of the first defining layer 210 may be formed as a slope. For the related description, relevant contents in an embodiment below (e.g., an embodiment as shown in FIG. 4C with respect to a fabrication method of a substrate) may be referred to, which will not be repeated here. In the above case, an orthogonal projection of an upper surface of the first defining layer 210 (a side of the first defining layer 210 close to the second defining layer 220) on the base 100 coincides with an orthogonal projection of the second defining layer 220 on the base 100. Alternatively, the first defining layer and the second defining layer may be separately fabricated. For example, in at least one embodiment of the present disclosure, an orthogonal projection of a second defining layer on a base may be within an orthogonal projection of a first defining layer on the base, i.e., a size of the second defining layer is smaller than a size of the first defining layer.

For example, in at least one embodiment of the present disclosure, a patterning process may be a photolithography patterning process, which, for example, may include: coating a photoresist layer on a structure layer to be patterned, exposing the photoresist layer with a mask, developing the exposed photoresist layer to obtain a photoresist pattern, etching the structure layer with the photoresist pattern, and then optionally removing the photoresist pattern. It should be noted that, if the patterned structure layer includes a photoresist material, the process of coating the photoresist may not be required.

For example, in a substrate provided by at least one embodiment of the present disclosure, an orthogonal projection of a side of a third defining layer close to a base on the base is located within an orthogonal projection of a second defining layer on the base. In this way, in each opening, an exposed area of the second defining layer may be increased, that is, in a case no other structures (for example, a first electrode 310, a first inorganic encapsulation layer 400, a second inorganic encapsulation layer 500, and the like according to the embodiment shown in FIG. 2) are formed in the opening defined by a pixel defining layer, peripheral regions of an upper surface of the second defining layer may all be exposed. Exemplarily, as shown in FIG. 1B, an orthogonal projection of a lower surface of the third defining layer 230 on the base 100 is located within an orthogonal projection of an upper surface of the second defining layer 220 on the base 100. In this way, after an organic light emitting device is formed in the opening 201, a formed common electrode may be a full-surface electrode structure, which may reduce electrical resistivity of the common electrode.

For example, in at least one embodiment of the present disclosure, a material of the second defining layer will not be limited. For example, the material of the second defining layer may include indium tin oxide-(ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, and other transparent conductive materials, and may also include a magnesium aluminum alloy (MgAl), a lithium aluminum alloy (LiAl), or metal materials such as magnesium, aluminum, lithium and silver.

For example, in at least one embodiment of the present disclosure, in a case where an actual process condition is conformed to, a design thickness of the second defining layer may be increased. In this way, electrical resistivity of the second defining layer can be reduced, and electrical resistivity of a common electrode is further reduced.

For example, in at least one embodiment of the present disclosure, a material of the second defining layer may include a non-transparent metal material, for example, magnesium, aluminum, and the like. In this way, the second defining layer can also play a role as a black matrix, and it is no longer necessary to provide a black matrix in the substrate, which can simplify a structure of the substrate and simplify a process of fabricating the substrate, so as to reduce costs.

For example, in a substrate provided by at least one embodiment of the present disclosure, in a direction perpendicular to a plane where the base is located, a cross-sectional shape of the third defining layer includes at least one of a regular trapezoid, a rectangle, and an inverted trapezoid, and the like. The cross section connects two adjacent openings of a pixel defining layer. Exemplarily, as shown in FIG. 1B, in a Z-axis direction, the cross-sectional shape of the third defining layer 230 is an inverted trapezoid, and in a direction from a lower surface to an upper surface, a width of the third defining layer 230 is gradually increased. The cross-sectional shape of the third defining layer is not limited thereto, and may be designed according to an actual process.

For example, in at least one embodiment of the present disclosure, the first defining layer may include a lyophobic layer and a lyophilic layer, and the lyophilic layer is located between the lyophobic layer and the base. The lyophilic layer is hydrophilic with respect to ink used in inkjet printing, and the lyophobic layer is hydrophobic with respect to ink used in inkjet printing. Exemplarily, as shown in FIG. 1B, a first defining layer 210 includes a lyophilic layer 211 and a lyophobic layer 212, and the lyophilic layer 211 is located between the lyophobic layer 212 and a base 100. In an inkjet printing process, the lyophilic layer 211 may restrain ink within an opening 201, and facilitate spreading of ink in the opening 201, which is favorable for dried ink to form a film layer with a more uniform thickness. The lyophobic layer 212 may prevent ink from climbing, which may improve uniformity of a member formed of ink (for example, a light-emitting material layer 320 in FIG. 2) and improve a yield of the substrate. In addition, in a process of drying ink, under a joint action of the lyophilic layer 211 and the lyophobic layer 212, ink will shrink toward the lyophilic layer 211, and will not remain on a second defining layer 220, which, thus, will not affect connection between the second defining layer 220 with an electrode (a first electrode 310 according to an embodiment below) of an organic light emitting device in a subsequent process.

In at least one embodiment of the present disclosure, thicknesses of the lyophilic layer and the lyophobic layer will not be limited. For example, as shown in FIG. 1B, the lyophilic layer 211 may have a thickness of about 200 nm to 800 nm, for example, 400 nm, 500 nm, or 600 nm, and the like. A material of the lyophilic layer 211 may include silicon nitride, silicon oxide (for example, silicon dioxide), and other inorganic material, which are hydrophilic, and may also include an organic material containing a hydrophilic group such as a hydroxyl group. The lyophobic layer 212 may have a thickness of about 400 nm to 2000 nm, for example, 600 nm, 800 nm, 1000 nm, 1400 nm, or 1600 nm, and the like. A material of the lyophobic layer 212 may include a material such as polyimide, and may also include a compound containing a halogen such as fluorine and chlorine.

It should be noted that, in at least one embodiment of the present disclosure, hydrophobicity and hydrophilicity are defined with respect to ink used in inkjet printing. If a material layer has a lyophobic property with respect to ink used in inkjet printing, the material layer is hydrophobic; and accordingly, if a material layer has a lyophilic property with respect to ink used in inkjet, the material layer is hydrophilic.

In at least one embodiment of the present disclosure, a mode in which a lyophilic layer and a lyophobic layer in a first defining layer are formed will not be limited, which may be selected according to an actual process. For example, a material layer having a hydrophilic property and a material layer having a hydrophobic property may be sequentially deposited on a base, and the lyophilic layer and the lyophobic layer are respectively formed after a patterning process. Alternatively, for example, a material layer having a hydrophilic property is deposited on a base, and then subjected to a doping process, for example, with a gas including a halogen compound, etc., so that a portion of the material layer away from the base is hydrophobic; after the material layer is subjected to a patterning process, a hydrophilic portion in the material layer is a lyophilic layer, and a hydrophobic portion in the material layer is a lyophobic layer. For example, a material of the first defining layer may include photoresist, in which a hydrophilic material or a hydrophobic material may be doped.

In at least one embodiment of the present disclosure, a specific structure of a base in a substrate will not be limited. For example, as shown in FIG. 1B, a base 100 may be an array substrate. The array substrate may include a structure layer or a functional layer, and the like; and the structure layer includes, for example, a buffer layer, a passivation layer, and the like; the functional layer includes, for example, a driving circuit, and the like; and the driving circuit may include a gate line, a data line, a transistor, a capacitor, and the like.

For example, in at least one embodiment of the present disclosure, an opening may be divided into regions according to a multilayer structure in a pixel defining layer, to describe a specific position of a member formed in the opening. Exemplarily, as shown in FIG. 1B, a region defined by a first defining layer 210 is a first opening 201a, a region defined by a second defining layer 220 is a second opening 201b, and a region defined by a third defining layer 230 is a third opening 201c.

For example, a substrate provided by at least one embodiment of the present disclosure further comprises: a light-emitting material layer and a first electrode located in an opening, the light-emitting material layer being located between the first electrode and a base, and the first electrode being in contact with a surface of the second defining layer away from the base. The first electrode is connected with an upper surface of the second defining layer to form a common electrode, and the second defining layer is provided such that the common electrode is not limited by a thickness of a pixel defining layer, which reduces a step difference of the common electrode and reduces a risk of fracture of the common electrode.

Figure 2:
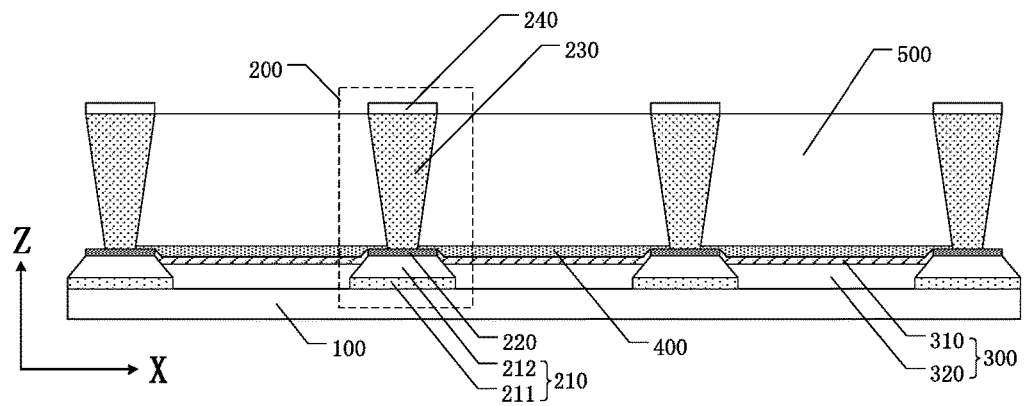
FIG. 2 is a cross-sectional view of another substrate provided by an embodiment of the present disclosure.

FIG. 2 is a cross-sectional view of another substrate provided by an embodiment of the present disclosure. Exemplarily, as shown in FIG. 2, a substrate 100 is provided thereon with an organic light emitting device 300, wherein, the organic light emitting device 300 may include a first electrode 310, a second electrode, and a light-emitting material layer 320 located between the first electrode 310 and the second electrode 320. The first electrode 310 and the light-emitting material layer 320 are formed in the opening 201 of a pixel defining layer 200. For example, the light-emitting material layer 320 is formed in a first opening 201a, or formed in the first opening 201a and a second opening 201b; the first electrode 310 is in contact with an upper surface of a second defining layer 220, to form a common electrode of a plurality of organic light emitting devices 300. It should be noted that, a second electrode in the organic light emitting device 300 is not shown in the diagram, and the second electrode may be a pixel electrode. The pixel electrode may be provided in the first opening 201a, or, the pixel electrode may also be provided in the base 100, that is, after the pixel electrode is formed on the base 100, the pixel defining layer 200 is formed on the base 100.

In at least one embodiment of the present disclosure, a type and a material of a first electrode 310 in an organic light emitting device will not be limited. For example, the first electrode 310 (or a common electrode constituted by the first electrode 310 and a second defining layer 220) may be an anode or a cathode. The anode may be formed, for example, of a transparent conductive material having a high work function, whose electrode material may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, and the like; the cathode may be formed, for example, of a material having high conductivity and a low work function, whose electrode material may include a magnesium aluminum alloy (MgAl), a lithium aluminum alloy (LiAl), and other alloys, or a single metal such as magnesium, aluminum, lithium and silver.

In at least one embodiment of the present disclosure, an emission mode of an organic light emitting device will not be limited. For example, the emission mode of the organic light emitting device may be top emission or bottom emission. For example, in a case where the emission mode of the organic light emitting device is top emission, a first electrode 310 may be a transparent electrode or a semi-transparent electrode. For example, a material of the first electrode 310 includes a magnesium aluminum alloy, and the first electrode 310 may have a thickness of about 12 nm to 22 nm.

In at least one embodiment of the present disclosure, a type and a material of a light-emitting material layer 320 in an organic light emitting device will not be limited. For example, the light-emitting material layer 320 may include an organic light-emitting layer. A material of the organic light-emitting layer may be selected according to a color of emitted light. For example, a material for preparing the organic light-emitting layer includes a fluorescent light-emitting material or a phosphorescent light-emitting material. For example, the organic light-emitting layer may be made with a doping system, in which a dopant material is mixed in a host light-emitting material to obtain a usable light-emitting material. For example, the host light-emitting material may be a metal compound material, an anthracene derivative, an aromatic diamine compound, a triphenylamine compound, an aromatic triamine compound, a biphenyldiamine derivative, or a triarylamine polymer, and the like. For example, the light-emitting material layer 320 may further include other functional layers, which may include, for example, a hole injection layer, a hole transport layer, an electron transport layer, an electron injection layer, and the like.

For example, a substrate provided by at least one embodiment of the present disclosure further comprises: a first inorganic encapsulation layer, located in an opening, and located on a side of a first electrode away from a base. Exemplarily, as shown in FIG. 2, a first inorganic encapsulation layer 400 is located in the opening 201 defined by a pixel defining layer 200. For example, a material of the first inorganic encapsulation layer 400 may include silicon oxide, silicon nitride, or silicon oxynitride, and other inorganic materials. The first inorganic encapsulation layer 400 has a high density, and may prevent water, oxygen, etc. from intruding into an organic light emitting device 300. For example, the first inorganic encapsulation layer 400 may be formed by using a process such as Chemical Vapor Deposition (CVD).

For example, a substrate provided by at least one embodiment of the present disclosure further comprises: a second organic encapsulation layer, located on a side of a first inorganic encapsulation layer away from a base, and the second organic encapsulation layer being at least partially located in the opening defined by a pixel defining layer. Exemplarily, as shown in FIG. 2, a second organic encapsulation layer 500 is at least partially located in an opening 201 defined by a pixel defining layer 200. The second organic encapsulation layer 500 may further encapsulate the substrate, to prevent water, oxygen, etc. from intruding into an organic light emitting device 300. In addition, the second organic encapsulation layer 500 has a relatively large thickness and a certain flexibility, which may play a role in planarization and buffering.

The second organic encapsulation layer 500 typically needs to be cured during a formation process, and during the curing process, a volume of the second organic encapsulation layer 500 will expand to some extent. As shown in FIG. 2, in a case where a cross-sectional shape of a third defining layer 230 is an inverted trapezoid, the second organic encapsulation layer 500 is further expanded to further fill space in the opening 201, and the second organic encapsulation layer 500 is tightly bonded with the third defining layer 230, to further prevent water, oxygen, etc. from intruding into the organic light emitting device 300. For example, a material of the second organic encapsulation layer 500 and a material of the third defining layer 230 may both include an organic material or a material of a same polarity, which, thus, may further improve a bonding strength between the second organic encapsulation layer 500 and the third defining layer 230.

The material of the second organic encapsulation layer 500 may be a polymer material containing a desiccant or a polymer material able to block moisture, for example, a polymer resin, and the like, and may also be a water-absorbing material, which may be, for example, an alkali metal (for example, Li and Na), an alkali earth metal (for example, Ba and Ca), or other moisture-reactive metals (for example, Al and Fe); and may also be an alkali metal oxide (for example, $Li_2O$ and $Na_2O$), an alkaline earth metal oxide (for example, MgO, CaO and BaO), a sulfate (for example, anhydrous $MgSO_4$), a metal halide (for example, $CaCl_2$) or a perchlorate (for example, $Mg(ClO_4)_2$), and the like.

In at least one embodiment of the present disclosure, a specific position for providing a second organic encapsulation layer 500 will not be limited. For example, an upper surface of the second organic encapsulation layer 500 may be located in a same horizontal plane as an upper surface of a third defining layer 230; or the upper surface of the second organic encapsulation layer 500 may be located below the upper surface of the third defining layer 230; or the upper surface of the organic encapsulation layer 500 is located above the upper surface of the third defining layer 230, for example, the second organic encapsulation layer 500 may be provided to cover an entire pixel defining layer 200.

In at least one embodiment of the present disclosure, a thickness of a second organic encapsulation layer 500 will not be limited. For example, the second organic encapsulation layer 500 may have a thickness of about 3 microns to 10 microns. Accordingly, a thickness of a third defining layer 230 may be designed according to positional relationship with the second organic encapsulation layer 500. For example, an upper surface of the second organic encapsulation layer 500 may be located in a same horizontal plane as an upper surface of a third defining layer 230, and the third defining layer 230 may have a thickness of about 3 microns to 10 microns.

It should be noted that, in a process of forming the second organic encapsulation layer 500, the third defining layer 230 (or a second defining layer 220, the third defining layer 230, and a fourth defining layer 240 according to an embodiment below) may limit a position of the second organic encapsulation layer 500, so as to prevent the second organic encapsulation layer 500 from affecting uniformity of its distribution due to flow before curing, which may improve an encapsulation effect of the substrate.

Hereinafter, a technical solution in at least one embodiment of the present disclosure will be described, with a case where the upper surface of the second organic encapsulation layer 500 shown in FIG. 2 may be located in a same horizontal plane as the upper surface of the third defining layer 230 as an example.

For example, in a substrate provided by at least one embodiment of the present disclosure, a third defining layer is hydrophobic, and is lyophilic with respect to the material of the second organic encapsulation layer. Exemplarily, as shown in FIG. 2, the third defining layer 230 is hydrophobic with respect to ink used in inkjet printing, and thus, during a drying procedure of ink, ink may be prevented from remaining on a sidewall of the third defining layer 230, which is favorable for forming a light-emitting material layer 320 in a first opening 201a (or the first opening 201a and a second opening 201b); in addition, the third defining layer 230 is lyophilic with respect to the material of the second organic encapsulation layer 500, which, during a process of forming the second organic encapsulation layer 500, may make the material for forming the second organic encapsulation layer 500 be bound in an opening 201.

For example, in a substrate provided by at least one embodiment of the present disclosure, a pixel defining layer further includes: a fourth defining layer, located on a side of a third defining layer away from a base, wherein, the fourth defining layer is hydrophobic, and is lyophobic with respect to the material of the second organic encapsulation layer. Exemplarily, as shown in FIG. 2, a fourth defining layer 240 is located above a third defining layer 230. The fourth defining layer 240 is hydrophobic, and thus, during inkjet printing, ink may roll into an opening 201 without remaining on the fourth defining layer 240, and may prevent ink in one opening 201 from entering an adjacent opening 201, which will not disturb a performance of a light-emitting material layer 320 formed in each opening; likewise, the fourth defining layer 240 is lyophobic with respect to the material of a second organic encapsulation layer 500, which, during a process of forming the second organic encapsulation layer 500, may prevent the material for forming the second organic encapsulation layer 500 from remaining on the fourth defining layer 240, so that the second organic encapsulation layer 500 is formed in the opening 201.

For example, in at least one embodiment of the present disclosure, a third defining layer and a fourth defining layer may be integrally formed, that is, the third defining layer and the fourth defining layer may be obtained by performing a patterning process on a same material layer. Exemplarily, as shown in FIG. 2, after a material layer having a lyophilic property with respect to a second organic encapsulation layer 500 is deposited on a base, a surface of the material layer away from the base 100 is processed by using a doping process, such that a portion of the material layer away from the base 100 is lyophobic with respect to the second organic encapsulation layer 500, and then the material layer is subjected to a patterning process, to respectively obtain the third defining layer 230 and the fourth defining layer 240.

Figure 3:
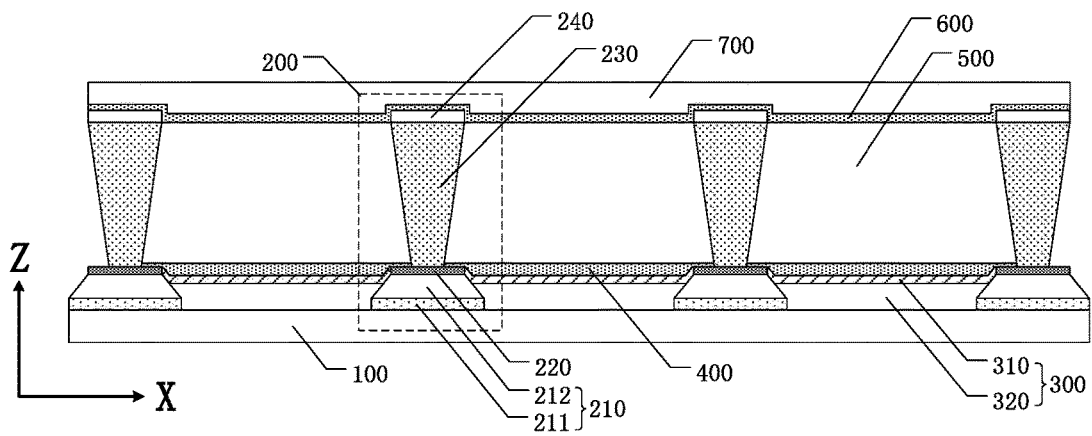
FIG. 3 is a cross-sectional view of another substrate provided by an embodiment of the present disclosure.

For example, in at least one embodiment of the present disclosure, a substrate as shown in FIG. 2 may be further encapsulated, to protect the substrate. FIG. 3 is a cross-sectional view of another substrate provided by an embodiment of the present disclosure.

For example, in at least one embodiment of the present disclosure, a substrate may further comprise a third inorganic encapsulation layer provided on a side of a second organic encapsulation layer away from a base. Exemplarily, as shown in FIG. 3, a third inorganic encapsulation layer 600 is provided to cover an upper surface of a second organic encapsulation layer 500. For example, the third inorganic encapsulation layer 600 may be further provided to cover an entire upper surface of a pixel defining layer 200. A material of the third inorganic encapsulation layer 600 may include silicon oxide, silicon nitride, or silicon oxynitride, and other inorganic materials. The third inorganic encapsulation layer 600 has a high density, and may prevent water, oxygen, etc. from intruding into an organic light emitting device 300. For example, the third inorganic encapsulation layer 600 may be formed by using a process such as chemical vapor deposition.

For example, in at least one embodiment of the present disclosure, a substrate may further comprise a planarization layer provided on a side of a pixel defining layer away from the base. For example, in a case where the substrate is provided therein with a third inorganic encapsulation layer 600 as shown in FIG. 3, the planarization layer may be provided on the third inorganic encapsulation layer 600. Exemplarily, as shown in FIG. 3, a planarization layer 700 is located on a pixel defining layer 200, or the planarization layer 700 is located above the third inorganic encapsulation layer 600. The planarization layer 700 may further encapsulate the substrate, to prevent water, oxygen, etc. from intruding into the substrate. The planarization layer 700 may planarize a surface of the substrate, so that the substrate has a uniform thickness, and facilitate arrangement of a member such as an encapsulation cover plate, in a subsequent fabrication process of the substrate.

For example, a material of the planarization layer 700 may include an organic material, for example, an epoxy resin, polyimide, polyamide, acrylic acid, or other suitable materials.

At least one embodiment of the present disclosure provides a display device, which may be a display panel comprising the substrate according to any one of the foregoing embodiments. For example, the substrate may be used as an array substrate in the display panel.

For example, in one example of the present disclosure, a variety of organic light emitting devices emitting light of different colors (for example, red, green, blue, etc.) may be formed in the array substrate in the display device, and a surface of a light outgoing side of the array substrate may be planarized, after encapsulation of the array substrate is completed, and then the display device is obtained, which, thus, may facilitate formation of other structures (for example, a touch panel, and the like) on the array substrate; or an encapsulation cover plate may also be provided on the light outgoing side of the array substrate, the encapsulation cover plate and the array substrate may be bonded together with an optical adhesive, and the encapsulation cover plate has a certain strength, which may protect the array substrate.

For example, in another example of the present disclosure, the organic light emitting device in the array substrate emits white light or a monochromatic short-wavelength light such as blue light, and the like. For example, a color filter substrate may be provided in the display device, and the color filter substrate is cell-assembled with the array substrate, which, thus, may implement color display. For example, a color filter layer of the color filter substrate may be provided therein with different types of quantum dots, which, as excited by monochromatic short-wavelength light, may emit light of different colors, so that color display may also be implement; in addition, the quantum dots may have a good dispersion effect on light, which may increase a viewing angle of a display image of the display device.

For example, the display device is a tablet personal computer, a television, a monitor, a laptop, a digital photo frame, a navigator, and any other product or component having a display function, which will not be limited in at least one embodiment of the present disclosure.

At least one embodiment of the present disclosure provides a fabrication method of a substrate, comprising: providing a base; forming a pixel defining layer on the base, a plurality of openings being formed in the pixel defining layer; wherein, the pixel defining layer includes a first defining layer, a second defining layer and a third defining layer sequentially formed on the base, the second defining layer is formed as a conductive layer, and an orthogonal projection of the second defining layer on the base is at least partially located outside an orthogonal projection of a side of the third defining layer close to the base on the base. In the substrate obtained by using the above-described fabrication method, the pixel defining layer having a three-layer structure may enhance its ability to store ink, and accordingly, may increase a thickness of a film layer formed by ink, so as to facilitate adjustment of thicknesses of respective film layers in an organic light emitting device formed in the pixel defining layer in a subsequent process; in addition, after the thicknesses of the respective film layers in the organic light emitting device are increased, a step difference between a surface of the film layer away from the base and a surface of the first pixel defining layer away from the base is reduced, which even enables the surface of the film layer away from the base and the surface of the first pixel defining layer away from the base to be located within a same horizontal plane, and accordingly, a step difference of a common electrode of the organic light emitting device (a height difference between a first electrode and the second defining layer according to an embodiment below) will also be reduced, which further eliminates the step difference, improves an electrical performance of the organic light emitting device, and improves a yield of the substrate.

For example, in a fabrication method provided by at least one embodiment of the present disclosure, an orthogonal projection of the first defining layer on the base coincides with an orthogonal projection of the second defining layer on the base. For example, the first defining layer and the second defining layer may be formed in a same patterning process, or the first defining layer may be subjected to a patterning process with the second defining layer as a mask.

For example, in a fabrication method provided by at least one embodiment of the present disclosure, an orthogonal projection of a side of the third defining layer close to the base on the base is located within an orthogonal projection of the second defining layer on the base. In this way, in each opening, an exposed area of the second defining layer may be increased, that is, in a case no other structures (for example, a first electrode 310, a first inorganic encapsulation layer 400, a second inorganic encapsulation layer 500, and the like according to the embodiment shown in FIG. 2) are formed in the opening defined by a pixel defining layer, peripheral regions of an upper surface of the second defining layer may all be exposed, and after an organic light emitting device is formed in the opening, a formed common electrode may be a full-surface electrode structure, which may reduce electrical resistivity of the common electrode.

For example, in a fabrication method provided by at least one embodiment of the present disclosure, the forming the pixel defining layer includes: depositing a first insulating material thin film on the base and performing a patterning process on the first insulating material thin film to form a first defining layer; depositing a conductive material thin film on the base and performing a patterning process on the conductive material thin film to form a second defining layer; and depositing a second insulating material thin film on the base and performing a patterning process on the second insulating material thin film to form a third defining layer.

For example, a fabrication method provided by at least one embodiment of the present disclosure further comprises: performing inkjet printing in the opening, forming a light-emitting material layer of the organic light emitting device after ink used in inkjet printing is dried; and depositing a conductive material on the light-emitting material layer to form a first electrode, the first electrode being partially in contact with a surface of the second defining layer away from the base. The above-described fabrication method may enable the first electrode and the upper surface of and the second defining layer to be connected with each other, so as to form a common electrode, and the second defining layer is provided such that the common electrode is not limited by a thickness of the pixel defining layer; since a height difference between the first electrode and the second defining layer is smaller than a height difference between the first electrode and an entire pixel defining layer, arrangement of the second pixel defining layer may reduce a step difference of the common electrode and reduce a risk of fracture of the common electrode.

For example, a fabrication method provided by at least one embodiment of the present disclosure further comprises: depositing an inorganic material thin film on the first electrode, to form a first inorganic encapsulation layer, and depositing an organic material on the first inorganic encapsulation layer and curing the same, to form a second organic encapsulation layer, wherein, the second organic encapsulation layer is at least partially located in an opening. The first inorganic encapsulation layer has a high density, and may prevent water, oxygen, etc. from intruding into an organic light emitting device formed in the opening, and the second organic encapsulation layer can further protect the substrate and enhance a blocking effect on water, oxygen, etc.; in addition, the second organic encapsulation layer has a relatively large thickness and a certain flexibility, which may play a role in planarization and buffering.

It should be noted that, for a specific structure of the substrate obtained by the fabrication method in the above-described embodiments of the present disclosure, relevant content in the foregoing embodiments (the embodiments about the substrate) may be referred to, which will not be repeated in the embodiment of the present disclosure. FIG. 4A to FIG. 4L are flow charts of a fabrication method of a substrate provided by an embodiment of the present disclosure. Hereinafter, in at least one embodiment of the present disclosure, as shown in FIG. 4A to FIG. 4L, with fabrication of the substrate as shown in FIG. 3 as an example, the fabrication method of the substrate may comprise steps below.

Figure 4A:
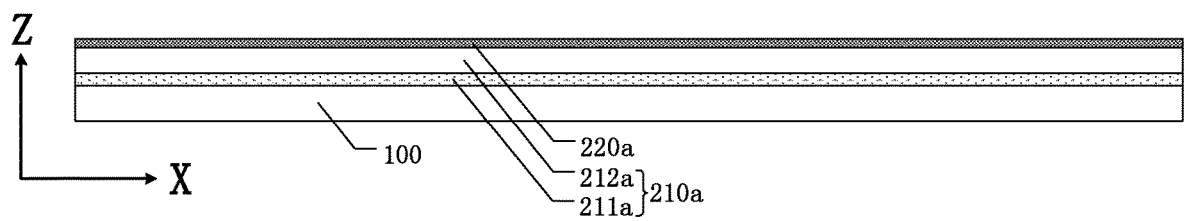
FIG. 4A to FIG. 4L are flow charts of a fabrication method of a substrate provided by an embodiment of the present disclosure.

As shown in FIG. 4A, a base 100 is provided, a first insulating material thin film 210a is formed on the base 100, the first insulating material thin film 210a is used for forming a first defining layer 210, a conductive material thin film 220a is deposited on the first defining layer 210, and the conductive material thin film 220a is used for forming a second defining layer 220.

It should be noted that, the first insulating material thin film 210a may include an insulating material thin film 211a which is hydrophilic (having a lyophilic property with respect to ink used in inkjet printing) and an insulating material thin film 212a which is hydrophobic (having a lyophobic property with respect to ink used in inkjet printing). For a specific structure of the first insulating material thin film 210a, related description of the first defining layer 210 in the foregoing embodiments (the embodiments about the substrate) may be referred to, which will not be repeated here. A fabrication process of the substrate may also be different depending on a material of the first insulating material thin film 210a.

Hereinafter, a technical solution in at least one embodiment of the present disclosure will be described, with a case where the material of the first insulating material thin film includes photoresist as an example. For example, in the embodiment shown in FIG. 4A to FIG. 4L, a specific procedure of a fabrication method of the first insulating material thin film 210a may include: depositing the photoresist on the base 100, wherein, the photoresist may be doped with a hydrophilic material, treating the photoresist with a gas including a halogen compound, so that a portion of the photoresist away from the base 100 is hydrophobic, and a portion of the photoresist close to the base 100 is still hydrophilic.

Figure 4B:
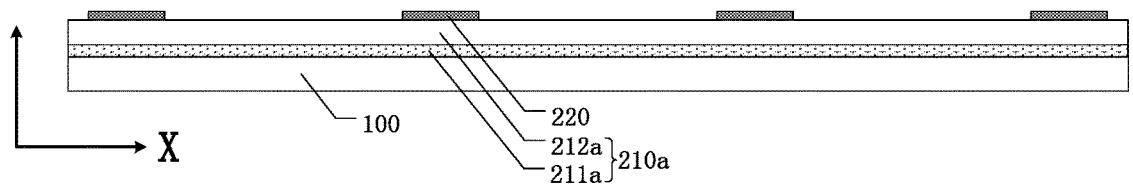
Figure 4C:
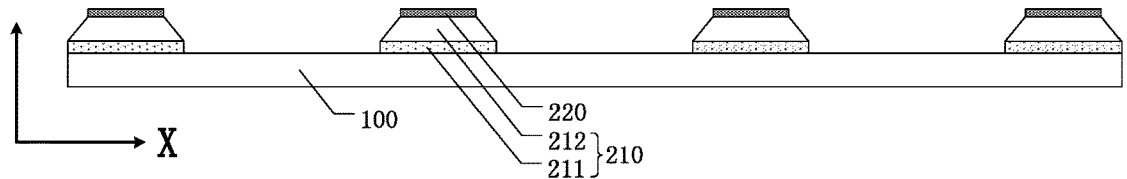

As shown in FIG. 4B, a patterning process is performed on the conductive material thin film 220a for forming a second defining layer 220, to form the second defining layer 220.

For a type of a conductive material of the conductive material thin film 220a, related description of the second defining layer 220 in the foregoing embodiments (the embodiments about the substrate) may be referred to, which will not be repeated here. Hereinafter, a technical solution in at least one embodiment below of the present disclosure will be described, with a case where the second defining layer 220 formed with the conductive material thin film 220a is non-transparent as an example.

As shown in FIG. 4C, with the second defining layer 220 as a mask, the photoresist (the first insulating material thin film 210a) for forming the first defining layer 210 is subjected to exposure, development, and other processes, to obtain the first defining layer 210. It should be noted that, in an actual process, during an exposure procedure, in an edge region of the mask (the second defining layer 220), light for exposure may cause diffraction, and other phenomena, so that photoresist corresponding to the region is not completely exposed, and after development, a structure layer formed by the photoresist, for example, a sidewall of the first defining layer 210, is a slope.

It should be noted that, in at least one embodiment of the present disclosure, a first defining layer 210 may also be firstly formed on the base 100, and then a conductive material thin film is deposited on the first defining layer 210 and a patterning process is performed on the same, to form a second defining layer 220.

Figure 4D:
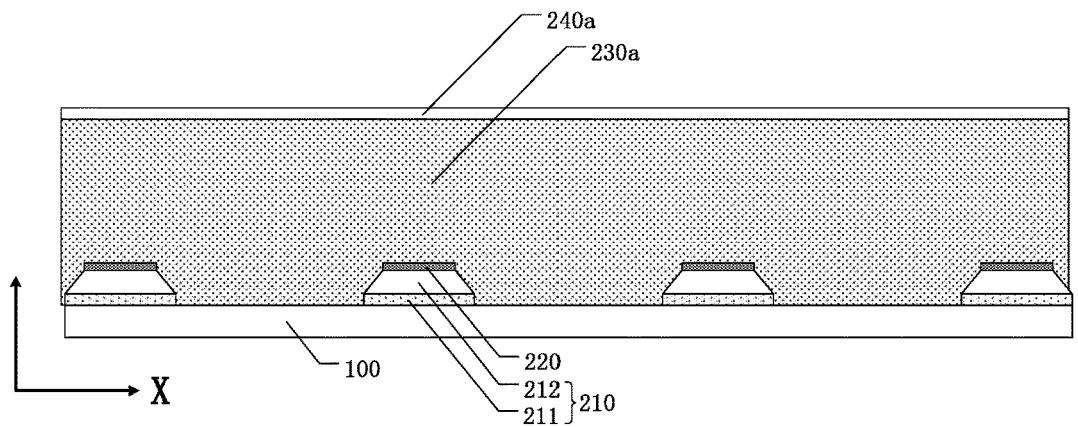

As shown in FIG. 4D, a second insulating material thin film 230a for forming a third defining layer 230 and an insulating material thin film 240a for forming a fourth defining layer 240 are sequentially deposited on the base 100. For specific materials of the two types of thin films, related description of the third defining layer 230 and the fourth defining layer 240 in the foregoing embodiments (the embodiments about the substrate) may be referred to, which will not be repeated here in the embodiment of the present disclosure.

Figure 4E:
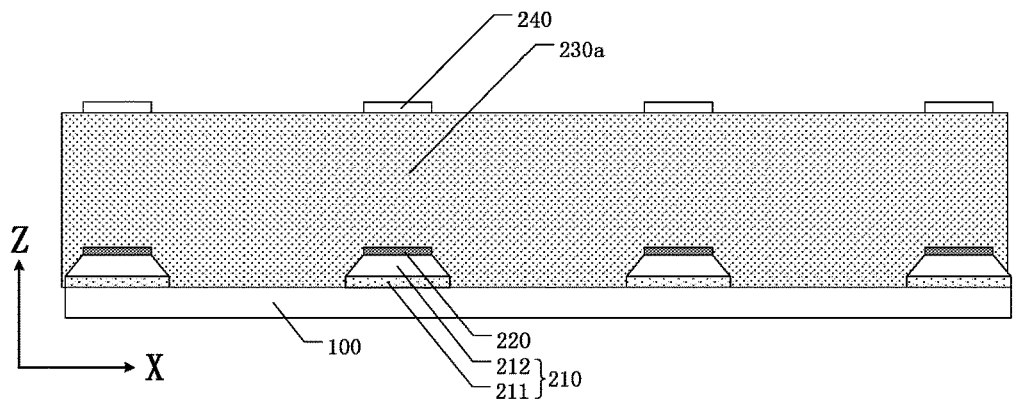

As shown in FIG. 4E, a patterning process is performed on the insulating material thin film 240a to form the fourth defining layer 240.

Figure 4F:
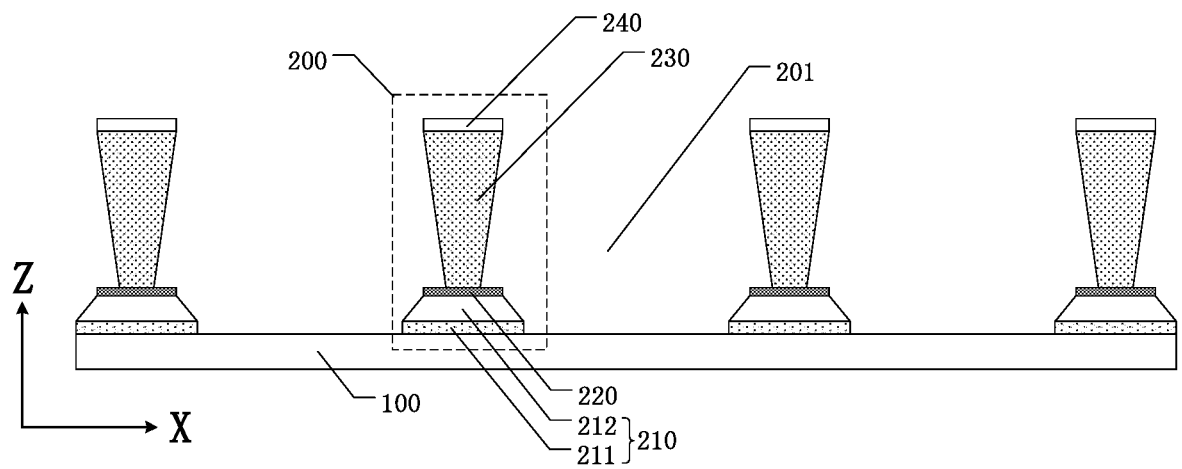

As shown in FIG. 4F, a patterning process is performed on the second insulating material thin film 230a to form the third defining layer 230, and thus, a pixel defining layer 200 is obtained. The formed pixel defining layer 200 defines a plurality of openings 201. For example, the second insulating material thin film 230a may include photoresist. For example, in the patterning process performed on the second insulating material thin film 230a, the photoresist may be incompletely exposed by light at the edge of the opening of the mask, due to diffraction or scattering, etc., so that a cross-sectional shape of the third defining layer 230 is formed as an inverted trapezoid. Alternatively, a patterning process may be performed on the second insulating material thin film 230a with a mask whose light transmittance changes gradually, so that the cross-sectional shape of the third defining layer 230 is formed as an inverted trapezoid, for example, the second insulating material thin film 230a may include negative photoresist.

It should be noted that, in at least one embodiment of the present disclosure, a third defining layer 230 and a fourth defining layer 240 may be formed by a patterning process with a same material layer. For the solution, related description in the foregoing embodiments (the embodiments about the substrate) may be referred to, which will not be repeated here in at least one embodiment of the present disclosure.

Figure 4G:
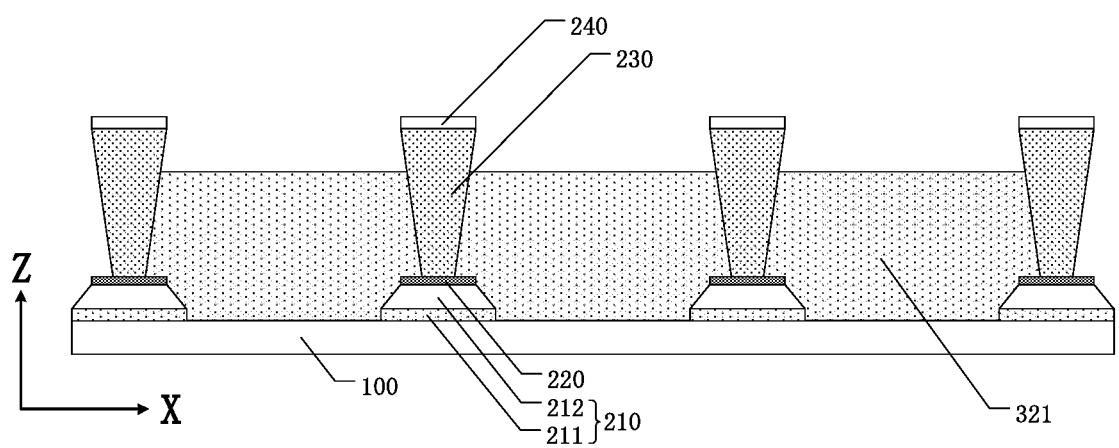

As shown in FIG. 4G, inkjet printing is performed in the opening 201 in the pixel defining layer 200. For example, a height of ink 321 in inkjet printing may be larger than a height of the first defining layer 210 or the second defining layer 220.

Figure 4H:
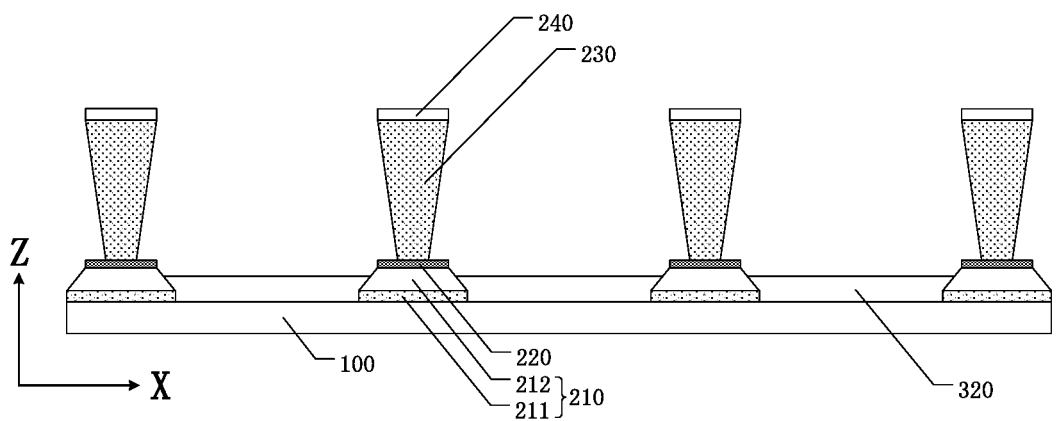

As shown in FIG. 4H, ink 321 is dried to form a light-emitting material layer 320. For a material, a structure, and a specific position of the light-emitting material layer 320, related content in the foregoing embodiments (the embodiments about the substrate) may be referred to, which will not be repeated here in the embodiment of the present disclosure.

Figure 4I:
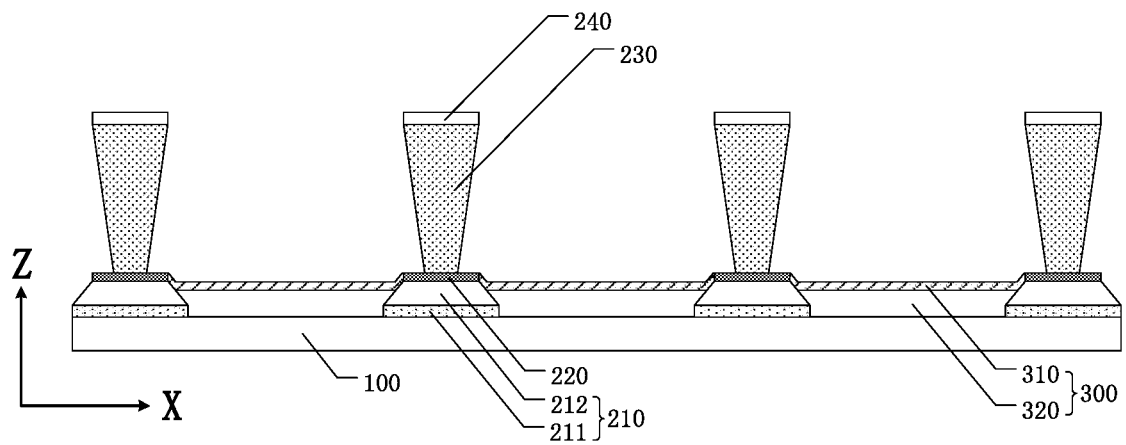

As shown in FIG. 4I, in the opening 201, a conductive material is deposited on the light-emitting material layer 320 to form a first electrode 310. As compared with a thickness of the first electrode 310, a thickness of the third defining layer 230 is relatively large, so in a procedure of forming the first electrode 310, the first electrode may be automatically disconnected at a sidewall of the third defining layer 230. For example, the first electrode 310 may be deposited on the light-emitting material layer 320 in a mode of vacuum evaporation, so that the light-emitting material layer 320 will not be damaged; under vacuum evaporation, an evaporation material has a certain diffusibility, so that the evaporation material may be in sufficient contact with an upper surface of the second defining layer 220; moreover, during the evaporation process, the evaporation material will be concentrated in the opening 201 by gravity, which facilitates formation of the first electrode 310. Alternatively, for example, under the premise of ensuring a function of the light-emitting material layer 320, the first electrode 310 may also be formed by magnetron sputtering or in other modes. For a material, a structure and a specific position of the first electrode 310, related content in the foregoing embodiments (the embodiments about the substrate) may be referred to, which will not be repeated here in the embodiment of the present disclosure.

Figure 4J:
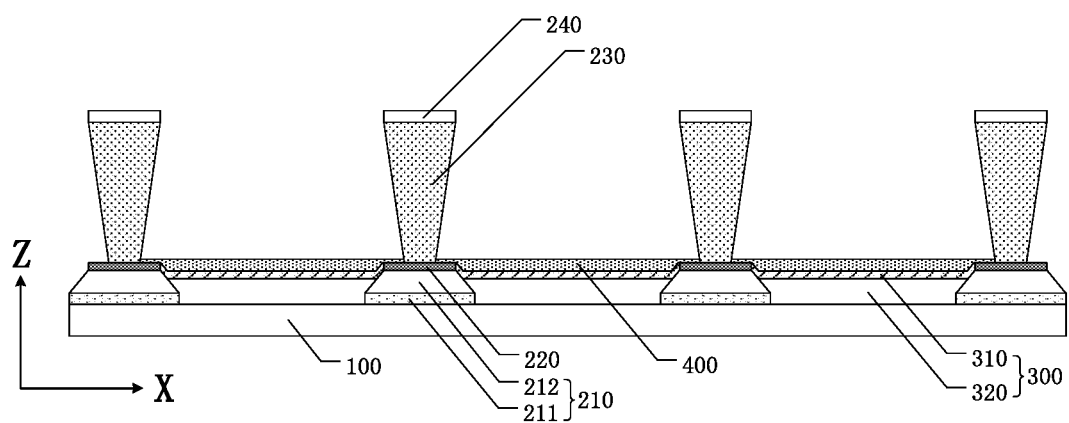

As shown in FIG. 4J, a first inorganic encapsulation layer 400 is formed in the opening 201 by using a chemical vapor deposition process. For a material, a structure and a position of the first inorganic encapsulation layer 400, related description in the foregoing embodiments (the embodiments about the substrate) may be referred to, which will not be repeated here in the embodiment of the present disclosure.

Figure 4K:
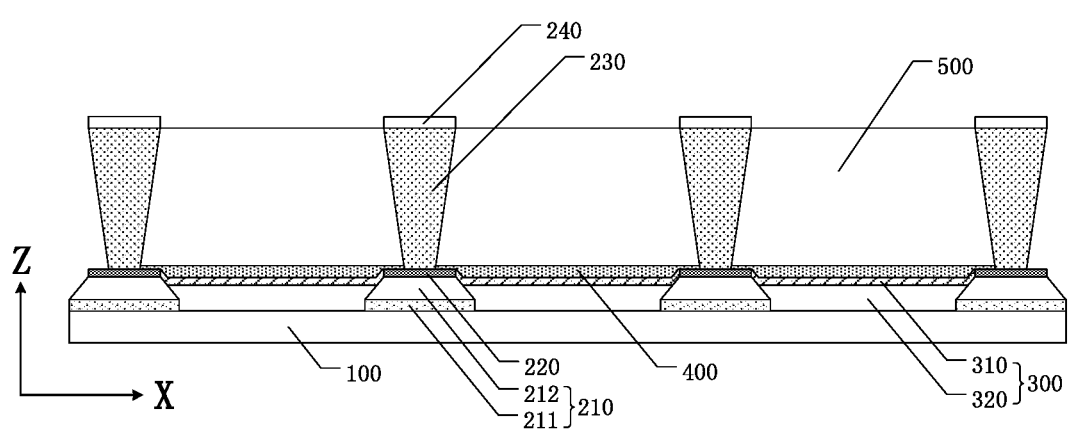

As shown in FIG. 4K, an organic insulating material is injected into the opening 201 and cured to form a second organic encapsulation layer 500. For a material, a structure and a position of the second organic encapsulation layer 500, related description in the foregoing embodiments (the embodiments about the substrate) may be referred to, which will not be repeated here in the embodiment of the present disclosure.

Figure 4L:
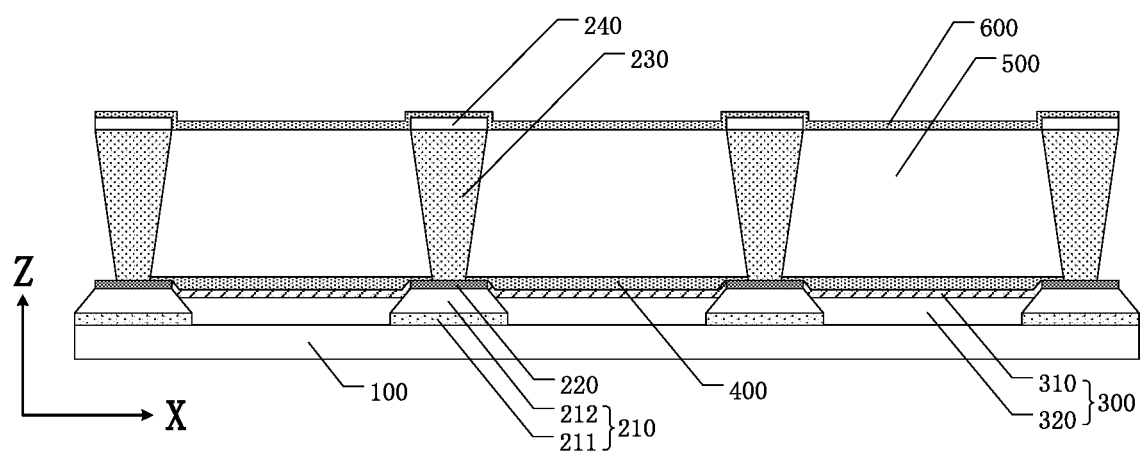

As shown in FIG. 4L, an inorganic material is deposited on the second organic encapsulation layer 500 to form a third inorganic encapsulation layer 600. For a material, a structure and a position of the third inorganic encapsulation layer 600, related description in the foregoing embodiments (the embodiments about the substrate) may be referred to, which will not be repeated here in the embodiment of the present disclosure.

As shown in FIG. 3, a planarization layer 700 is formed on the third inorganic encapsulation layer 600. For a material, a structure and a position of the planarization layer 700, related description in the foregoing embodiments (the embodiments about the substrate) may be referred to, which will not be repeated here in the embodiment of the present disclosure.

At least one embodiment of the present disclosure provides a substrate and a fabrication method thereof, and a display device, and may have at least one of beneficial effects below:

(1) In the substrate provided by at least one embodiment of the present disclosure, the pixel defining layer has a three-layer structure, which may enhance its ability to store ink, so as to facilitate adjustment of thicknesses of respective film layers in the organic light emitting device formed in the pixel defining layer in a subsequent process.

(2) In the substrate provided by at least one embodiment of the present disclosure, the arrangement of the second defining layer may reduce the step difference of the common electrode of the organic light emitting device, improve the electrical performance of the organic light emitting device, and enhance the yield of the substrate.

(3) In the substrate provided by at least one embodiment of the present disclosure, the second defining layer may include a non-transparent conductive material, so that the second defining layer may also play a role as a black matrix, and it is no longer necessary to provide a black matrix in the substrate, which may simplify the structure of the substrate and simplify the process of fabricating the substrate, so as to reduce costs.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to the actual scale.

(3) In case of no conflict, features in one embodiment or in different embodiments can be combined to obtain the new embodiment.

The present application claims priority of Chinese Patent Application No. 201810098359.5 filed on Jan. 31, 2018, the disclosure of which is incorporated herein by reference in its entirety as part of the present application.

The invention claimed is:

1. A substrate, comprising:
a base;
a pixel defining layer, a plurality of openings being formed in the pixel defining layer, the pixel defining layer including a first defining layer, a second defining layer and a third defining layer sequentially stacked on the base;
wherein, the second defining layer is configured as a conductive layer, and an orthogonal projection of the second defining layer on the base is at least partially located outside an orthogonal projection of a side of the third defining layer close to the base on the base.

2. The substrate according to claim 1, wherein
an orthogonal projection of the first defining layer on the base coincides with an orthogonal projection of the second defining layer on the base.

3. The substrate according to claim 1, wherein
the orthogonal projection of the side of the third defining layer close to the base on the base is located within the orthogonal projection of the second defining layer on the base.

4. The substrate according to claim 1, wherein
the first defining layer includes a lyophobic layer and a lyophilic layer, and the lyophilic layer is located between the lyophobic layer and the base.

5. The substrate according to claim 1, wherein
in a direction perpendicular to a plane where the base is located, a cross-sectional shape of the third defining layer includes at least one of a regular trapezoid, a rectangle, and an inverted trapezoid.

6. The substrate according to claim 1, further comprising:
a light-emitting material layer and a first electrode located in the opening, the light-emitting material layer being located between the first electrode and a base, and the first electrode being partially in contact with a surface of the second defining layer away from the base.

7. The substrate according to claim 6, further comprising:
a first inorganic encapsulation layer, located in the opening, and located on a side of a first electrode away from the base.

8. The substrate according to claim 7, further comprising:
a second organic encapsulation layer, located on a side of the first inorganic encapsulation layer away from the base, and the second organic encapsulation layer being at least partially located in the opening.

9. The substrate according to claim 8, wherein
the third defining layer is hydrophobic, and is lyophilic with respect to a material of the second organic encapsulation layer.

10. The substrate according to claim 8, wherein, the pixel defining layer further includes:
a fourth defining layer, located on a side of the third defining layer away from the base, wherein, the fourth defining layer is hydrophobic, and is lyophobic with respect to a material of the second organic encapsulation layer.

11. A display device, comprising the substrate according to claim 1.

12. A fabrication method of a substrate, comprising:
providing a base;
forming a pixel defining layer on the base, a plurality of openings being formed in the pixel defining layer;
wherein, the pixel defining layer includes a first defining layer, a second defining layer and a third defining layer sequentially formed on the base, the second defining layer is formed as a conductive layer, and an orthogonal projection of the second defining layer on the base is at least partially located outside an orthogonal projection of a side of the third defining layer close to the base on the base.

13. The fabrication method according to claim 12, wherein
an orthogonal projection of the first defining layer on the base coincides with the orthogonal projection of the second defining layer on the base.

14. The fabrication method according to claim 12, wherein
the orthogonal projection of the side of the third defining layer close to the base on the base is located within the orthogonal projection of the second defining layer on the base.

15. The fabrication method according to claim 12, wherein, the forming the pixel defining layer includes:
depositing a first insulating material thin film on the base and performing a patterning process on the first insulating material thin film to form the first defining layer;
depositing a conductive material thin film on the base and performing a patterning process on the conductive material thin film to form the second defining layer; and
depositing a second insulating material thin film on the base and performing a patterning process on the second insulating material thin film to form the third defining layer.

16. The fabrication method according to claim 12, further comprising:
performing inkjet printing in the opening, and forming a light-emitting material layer of an organic light emitting device after the ink in the inkjet printing is dried; and
depositing a conductive material on the light-emitting material layer to form a first electrode, the first electrode being partially in contact with a surface of the second defining layer away from the base.

17. The fabrication method according to claim 16, further comprising:
depositing an inorganic material thin film on the first electrode, to form a first inorganic encapsulation layer; and
depositing an organic material on the first inorganic encapsulation layer and curing the organic material, to form a second organic encapsulation layer;
wherein, the second organic encapsulation layer is at least partially located in the opening.

* * * * *